United States Patent
Huang

(10) Patent No.: US 10,361,369 B2
(45) Date of Patent: Jul. 23, 2019

(54) FLEXIBLE ORGANIC LIGHT EMITTING DIODE AND THE MANUFACTURING METHOD THEREOF

(71) Applicant: Shenzhen China Star Optoelectronics Technology Co., Ltd., Shenzhen, Guangdong (CN)

(72) Inventor: Hui Huang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 16/253,334

(22) Filed: Jan. 22, 2019

(65) Prior Publication Data

US 2019/0157557 A1 May 23, 2019

Related U.S. Application Data

(63) Continuation of application No. 15/544,253, filed on Jul. 17, 2017.

(51) Int. Cl.
*H01L 51/50* (2006.01)
*H01L 51/00* (2006.01)
*H01L 51/56* (2006.01)

(52) U.S. Cl.
CPC ...... *H01L 51/0003* (2013.01); *H01L 51/0005* (2013.01); *H01L 51/5056* (2013.01); *H01L 51/5072* (2013.01); *H01L 51/56* (2013.01); *H01L 51/5012* (2013.01); *H01L 2251/5338* (2013.01)

(58) Field of Classification Search
CPC .................................................. H01L 51/5084
See application file for complete search history.

(56) References Cited

U.S. PATENT DOCUMENTS

2015/0287920 A1* 10/2015 Nagaoka ............. H01L 51/0052
257/40

* cited by examiner

*Primary Examiner* — Cheung Lee
(74) *Attorney, Agent, or Firm* — Andrew C. Cheng

(57) ABSTRACT

A flexible OLED includes a substrate, an anode, a hole transport layer, a stopper chamber, an electron transport layer, a cathode, and a cover stacked in sequence. The stopper chamber is filled with a light emitting layer. Surfaces of the hole transport layer and the electron transport layer that face each other are provided with free $H^+$ ions that exchange with H atoms contained in a material of the light emitting layer to connect the light emitting layer to the surfaces of the hole transport layer and the electron transport layer.

9 Claims, 3 Drawing Sheets

FLEXIBLE ORGANIC LIGHT EMITTING DIODE AND THE MANUFACTURING METHOD THEREOF

CROSS REFERENCE TO RELATED APPLICATIONS

This is a continuation application of co-pending U.S. patent application Ser. No. 15/544,253, filed on Jul. 17, 2017, which is a national stage of PCT Application No. PCT/CN2017/090773, filed on Jun. 29, 2017, claiming foreign priority of Chinese Patent Application No. 201710443592.8 filed on Jun. 13, 2017.

BACKGROUND OF THE INVENTION

1. Field of the Invention

The present disclosure relates to display technology, and more particularly to a flexible organic light emitting diode (OLED and the manufacturing method thereof.

2. Discussion of the Related Art

In the field of lighting and display, due to the characteristics of OLED, such as low starting voltage, light, self-luminous, etc., the OLED has been widely used in the lighting products and panel industry, so as to achieve low energy consumption, light, surface light source, and other demands.

OLED light is generated by exciton compound, and then are emitted out from the light emitting layer to the air. Generally, with respect to the bottom emitting OLED components, the emitting path is: light emitting layer, anode, substrate, and air. That is, the light beams may arrive users eye after passing through four paths.

Flexible OLED devices are a major research direction in the future, but the main problem in the preparation of flexible OLED devices is that, after the substrate is bent, the structure between the layers will be affected by stress and other effects, resulting in molecular chain breakage and performance attenuation. In order to solve the above-mentioned technical problems, an improved technique relates to a liquid luminescent layer, which may be prepared as a flexible device for the reason that it is liquid or semi-solid. Also, the intermolecular link is not affected by the bending operation.

Although the structure of the liquid luminescent layer is simple, the liquid luminescent layer needs to be completed by pressing with the substrate and the cover plate, which leads to a decrease in the bonding ability between the organic layers. The electrical conductivity of the device may also be affected, the adhesion between the layers will lead to a decline in the device's attenuation efficiency.

SUMMARY

To overcome the above problem, the manufacturing method of the flexible OLED includes acidifying the surface of the electron transport layer and the hole transport layer adjacent to the liquid light emitting layer such that bonding anchoring effect may occur between the liquid luminescent layer and the functional layer, which provides better adhesion. The adhesion between the layers is enhanced so as to improve the carrier transport and injection efficiency.

In one aspect, a manufacturing process of flexible organic light emitting diodes (OLEDs), includes: S1: forming an anode and a hole transport layer on substrate being stacked in sequence, and forming a cathode and an electron transport layer being stacked in sequence; S2: applying an acidification process to a surface of the electron transport layer to obtain a cover assembly, and applying the acidification process to a surface of the hole transport layer; S3: forming a stopper chamber on the hole transport layer after being applied with the acidification process; S4: injecting liquid luminescent material into the stopper chamber to form a light emitting layer so as to obtain the substrate; S5: clasping the cover assembly on the substrate, and configuring the electron transport layer being applied with the acidification process to face toward the light emitting layer so as to obtain the flexible OLED.

Wherein step S2 further includes: immersing the electron transport layer and the hole transport layer into acid solution for a period from 10 min to 30 min; and then applying a dry process.

Wherein the acid solution is hydrochloric acid solution or sulfuric acid solution with a mass percentage equaling to 5% to 20%.

Wherein the liquid luminescent material comprises fluorescent material and a solvent.

Wherein the fluorescent material is selected from any one of rubrene, 8-hydroxyquinoline aluminum, BCzVBi and DSA-Ph; the solvent is carbazole-based material and triphenylamine-based material.

Wherein the step of forming the hole transport layer further includes: immersing the surfaces of the substrate and the anode in the hole precursor solution, the hole precursor solution is applied with a heating process to form materials of the hole transport material, the material of the hole transport material is attached to the surface of the anode, and the material of the hole transport layer is applied with an annealing process at the temperature in a range from 300° C. to 500° C. so as to form the hole transport layer on the anode; wherein the step of forming the electron transport layer further includes: immersing the surfaces of the cover and the anode on the cover in the electron precursor solution, the electron precursor solution is applied with the heating process to form materials of the electron transport material, the material of the electron transport material is attached to the surface of the cathode, and the material of the electron transport layer is applied with the annealing process at the temperature in the range from 300° C. to 500° C. so as to form the electron transport layer on the cathode.

Wherein the hole transport layer and the electron transport layer are $TiO_2$ film layers having a thickness in a range from 200 to 1000 nm, and the hole precursor solution and the electron precursor solution are $TiO_2$, solution having a concentration in a range from 15% to 35%.

Wherein the substrate and the anode on the substrate are immersed in the hole precursor solution, and are applied with a heating process having a temperature in a range from 40° C. to 80° C. for 4 hours to 12 hours.

Wherein the stopper chamber is made by $TiO_2$, and a depth of the stopper chamber is in a range from 10 to 100 nm.

In view of the above, when the cover assembly 2 clasps on the TFT array substrate 1, the free $H^+$ ions are on the surfaces of the electron transport layer 23 and the hole transport layer 13 so as to be bonded with the O atoms within the materials of the light emitting layer 15 by the hydrogen bonding. As such, the light emitting layer 15 is anchored on the surface of the electron transport layer 23 and the hole transport layer 13 to enhance the adhesive force. At the same time, the free H ions may exchange with the atoms within the materials of the light emitting layer 15, which contributes to the connection between the light emitting layer 15 and the electron transport layer 23, the hole transport layer 13. It can be understood that by applying the acidification process to the surfaces of the electron transport layer 23 and the hole transport layer 13, the connection between the light emitting layer 15 and the functions at two sides, the substrate 11, the anode 12 may be enhanced. Thus, the inter-layer bonding ability is strengthened, and the carrier transmission and injection efficiency may be enhanced.

DETAILED DESCRIPTION OF THE EMBODIMENTS

Figure 1:
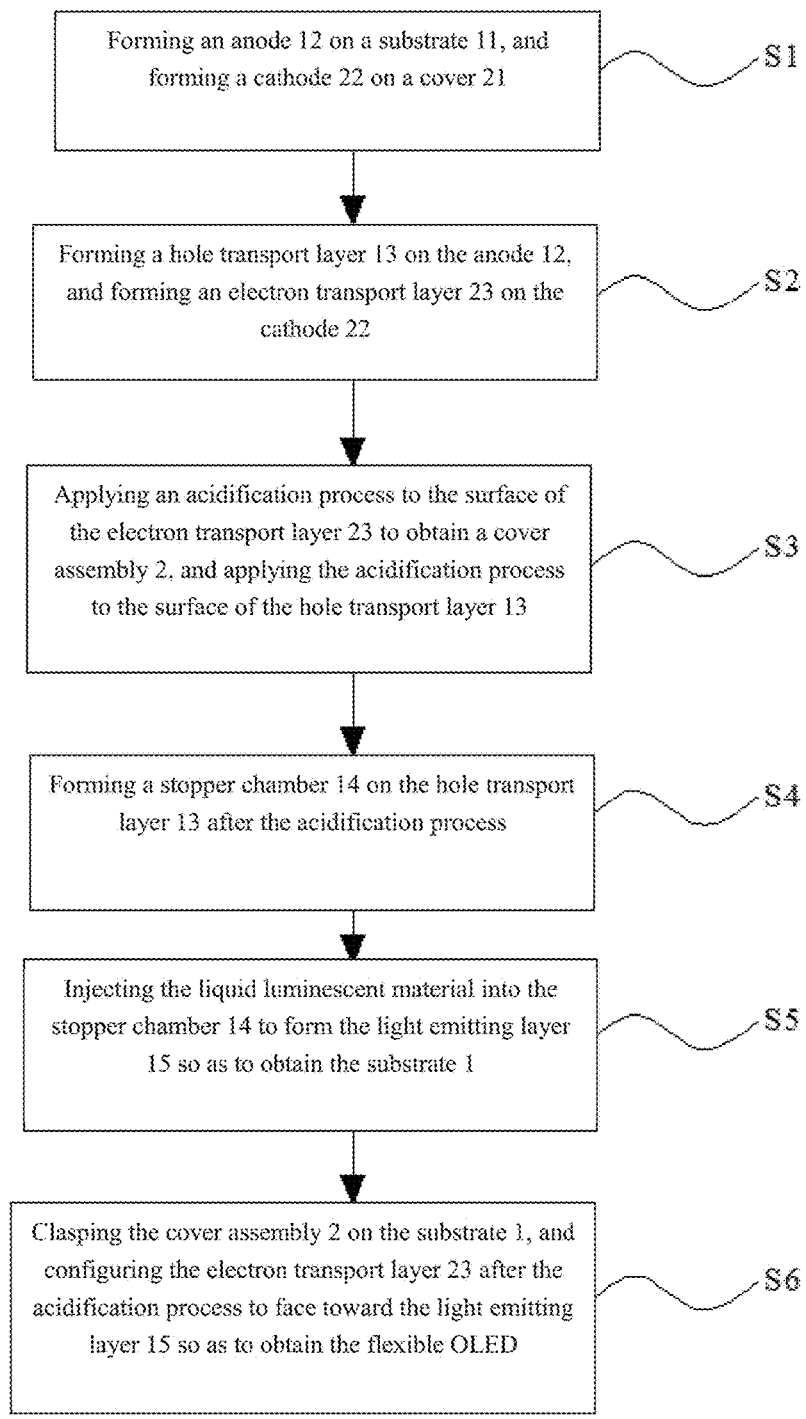
FIG. 1 is a flowchart illustrating the manufacturing method of the flexible OLED in accordance with one embodiment of the present disclosure.

Various example embodiments will now be described more fully with reference to the accompanying drawings in which some example embodiments are shown. In the drawings, the thicknesses of layers and regions may be exaggerated for clarity. In the following description, in order to avoid the known structure and/or function unnecessary detailed description of the concept of the invention result in confusion, well-known structures may be omitted and/or functions described in unnecessary detail.

FIG. 1 is a flowchart illustrating the manufacturing method of the flexible OLED in accordance with one embodiment of the present disclosure.

Figure 2:
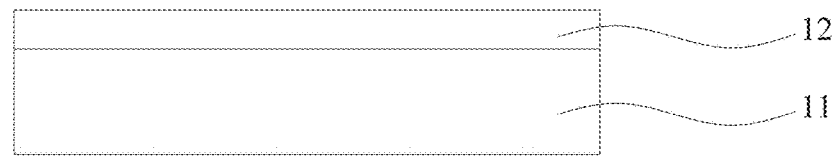
FIGS. 2-6 are schematic views illustrating the steps of the manufacturing method of the flexible OLED in accordance with one embodiment of the present disclosure.
Figure 2:
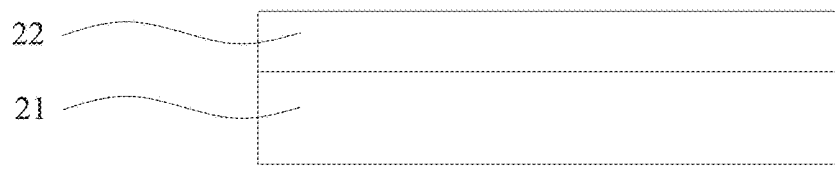

The method includes the following steps:

In step S1, forming an anode 12 on a substrate 11, and forming a cathode 22 on a cover 21, as shown in FIG. 2.

In the embodiment, the substrate 11 and the cover 21 are made by glass, and the anode 12 and the cathode 22 are made by ITO. However, the substrate 11, the cover 21, and the anode 12, and the cathode 22 may be made by other materials. In an example, the anode 12 and the cathode 22 may be made by metal electrode materials.

Figure 3:
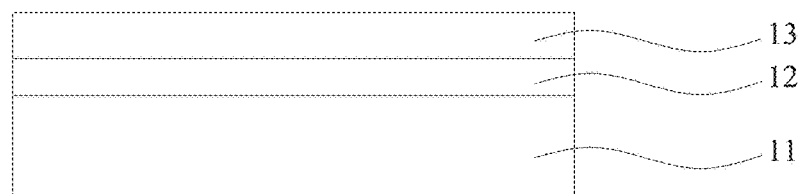
Figure 3:
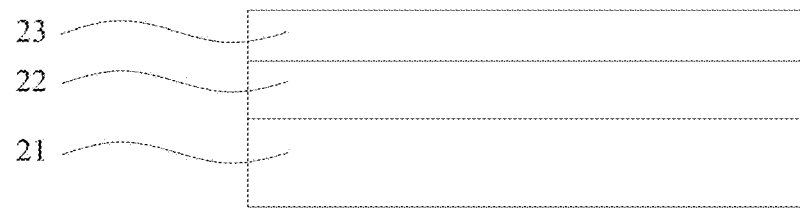

In step S2, forming a hole transport layer 13 on the anode 12, and forming an electron transport layer 23 on the cathode 22, as shown in FIG. 3.

In particular, the hole transport layer 13 may be formed by: immersing the surfaces of the substrate 11 and the anode 12 in the hole precursor solution. The hole precursor solution is applied with a heating process to form the materials of the hole transport material. The material of the hole transport layer is attached to the surface of the anode 12, and is applied with an annealing process at the temperature in a range from 300° C. to 500° C. In this way, the hole transport layer 13 is formed on the anode 12.

In the embodiment, the hole transport layer 13 may be made by $TiO_2$. In addition, a thickness of the $TiO_2$ film layer is in a range from 200 to 1000 nm. The hole precursor solution is $TiCl_4$, and the concentration of the hole precursor solution is in a range from 15% to 35% t %).

In particular, the materials and the manufacturing method of the electron transport layer 23 are substantially the same with that of the hole transport layer 13. That is, the electron transport layer 23 may be a $TiO_2$ film layer having a thickness ranging from 200 to 1000 nm. In addition, the hole precursor solution is $TiCl_4$, and the concentration of the hole precursor solution is in a range from 15% to 35% (wt %).

The materials of the hole transporting material and the electron transporting material are respectively immersed in the hole precursor solution and the electron precursor solution, and the heating process is conducted by the temperature in the range from 40° C. to 80° C. for 4 hours to 12 hours.

It is to be noted that, when the hole transport material and the electron transport material are respectively adhered to the surfaces of the anode 12 and the cathode 22. The annealing process contributes to the adhesive degree between the hole transport layer 13 and the anode 12, and between the electron transport layer 23 and the cathode 22.

In step S3, applying an acidification process to the surface of the electron transport layer 23 to obtain a cover assembly 2. The acidification process is applied to the surface of the hole transport layer 13, as shown in FIG. 4.

Specifically, the acidification process includes: immersing the electron transport layer 23 and the hole transport layer 13 into acid solution for a period from 10 min to 30 min, and then applying a dry process at a low temperature.

In particular, the acid solution is the hydrochloric acid solution or sulfuric acid solution with the mass percentage equaling to 5% to 20%.

Figure 4:
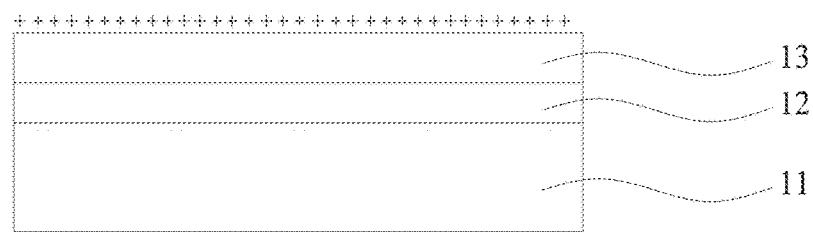
Figure 4:
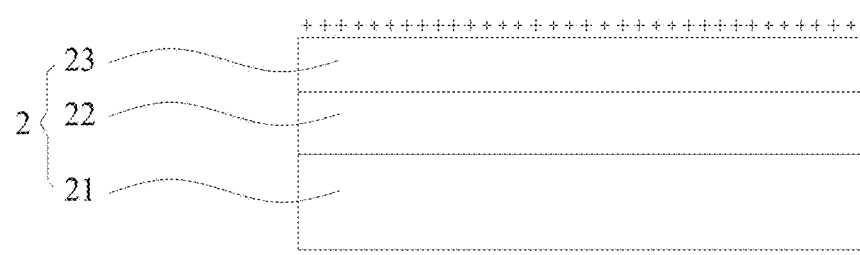

In FIG. 4, the "+" shown on the surface of the electron transport layer 23 and the hole transport layer 13 relates to the free $H^+$ ions formed by the acidification process.

As such, the $H^+$ ions are free on the surface of the electron transport layer 23 and the hole transport layer 13. In the embodiment, the electron transport layer 23 and the hole transport layer 13 may be made by $TiO_2$. The free $H^+$ ions may interact with the O atoms in $TiO_2$.

Figure 5:
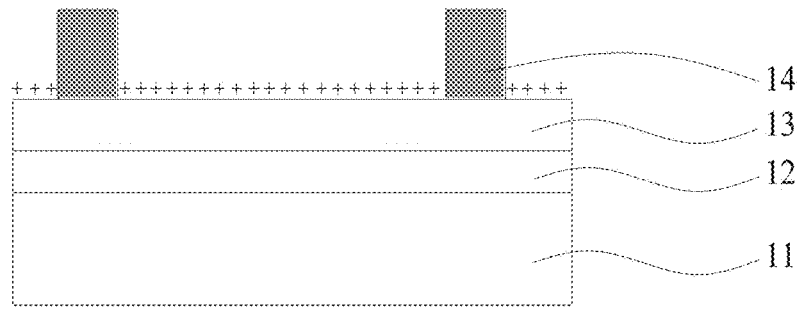

In step S4, a stopper chamber 14 is formed on the hole transport layer 13 after the acidification process, as shown in FIG. 5.

The stopper chamber 14 is formed on the hole transport layer 13 after the acidification treatment.

In one embodiment, the stopper chamber 14 is made by $TiO_2$, and a depth of the stopper chamber 14 is in a range from 10 to 100 nm.

Figure 6:
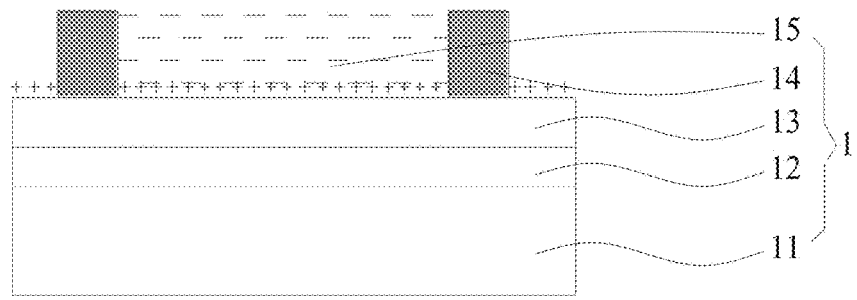

In step S5, injecting the liquid luminescent material into the stopper chamber 14 to form the light emitting layer 15 so as to obtain the substrate 1, as shown in FIG. 6.

The liquid luminescent material includes fluorescent material and a solvent, the solvent is preferably carbazole-based small molecule material, such as, triphenylamine-based material. The carbazole small molecule has a low glass transition temperature (typically 20° C. to 50° C.), and usually, the carbazole is liquid at a room temperature. According to the similar compatibility principle, the fluorescent material is an object doping into the carbazole-like small molecule as a dopant host, and the branched structure in the carbazole-like small molecule may be effectively combined with the fluorescent material to form the liquid luminescent material.

The fluorescent material may be configured according to the light-emitting requirements of the pre-fabricated flexible OLED. For example, when the fluorescent material is defined as rubrene, the formed light emitting layer 15 emits a red spectrum; if the fluorescent material is defined as 8-hydroxyquin, the light emitting layer 15 emits a green spectrum; if the fluorescent material is defined as any one of BCzVBi and DSA-Ph, the light emitting layer 15 is formed to emit a blue spectrum. Obviously, the fluorescent material may also select the material of other colors.

In step S6, clasping the cover assembly 2 on the substrate 1, and configuring the electron transport layer 23 after the acidification process to face toward the light emitting layer 15 so as to obtain the flexible OLED.

Figure 7:
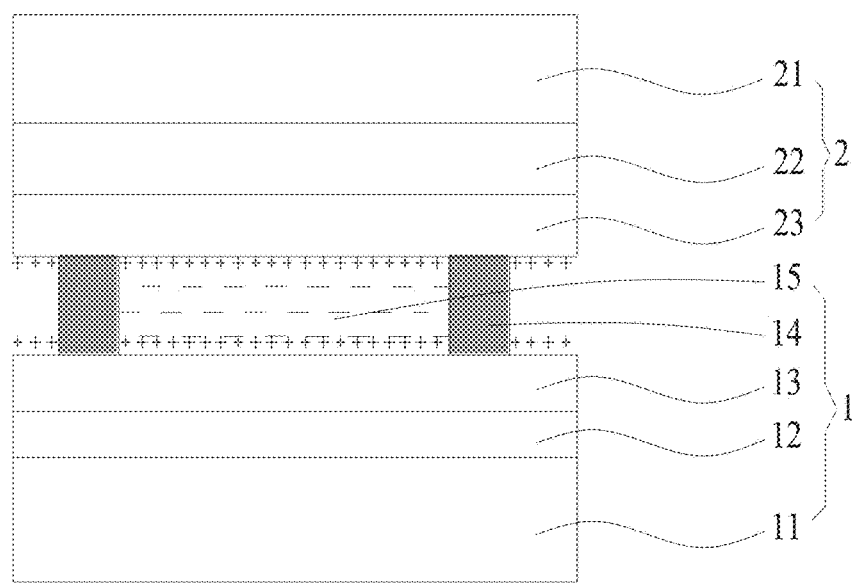
FIG. 7 is a schematic view of the flexible OLED in accordance with one embodiment of the present disclosure.

Thus, the flexible OLED, as shown in FIG. 7, may be obtained by the above manufacturing method. The flexible OLED includes a substrate 11, an anode 12, a hole transport layer 13, a stopper chamber 14, an electron transport layer 23, a cathode 22, and a cover 21 stacked in sequence, wherein the stopper chamber 14 is filled with the light emitting layer 15. In addition, the surfaces of the hole transport layer 13 and the electron transport layer 23 are adhered with free $H^+$ ions. As shown in FIG. 7, a great deal of the free $H^+$ ions are on the surfaces of the electron transport layer 23 and the hole transport layer 13. The free $H^+$ ions are between the electron transport layer 23 and the light emitting layer 15 and are between the hole transport layer 13 and the light emitting layer 15.

When the cover assembly 2 clasps on the TFT array substrate 1, the free $H^+$ ions are on the surfaces of the electron transport layer 23 and the hole transport layer 13 so as to be bonded with the O atoms within the materials of the light emitting layer 15 by the hydrogen bonding. As such, the light emitting layer 15 is anchored on the surface of the electron transport layer 23 and the hole transport layer 13 to enhance the adhesive force. At the same time, the free $H^+$ ions may exchange with the H atoms within the materials of the light emitting layer 15, which contributes to the connection between the light emitting layer 15 and the electron transport layer 23, the hole transport layer 13. It can be understood that by applying the acidification process to the surfaces of the electron transport layer 23 and the hole transport layer 13, the connection between the light emitting layer 15 and the functions at two sides, the substrate 11, the anode 12 may be enhanced. Thus, the inter-layer bonding ability is strengthened, and the carrier transmission and injection efficiency may be enhanced.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A flexible organic light emitting diode (OLED), comprising:
    a substrate,
    an anode formed on the substrate,
    a hole transport layer formed on the anode and having a surface on which free H ions are formed,
    a stopper chamber arranged on the surface of the hole transport layer,
    an electron transport layer disposed on the stopper chamber and having a surface facing the stopper chamber, free $H^+$ ions being formed on the surface of the electron transport layer,
    a cathode formed on a side of the electron transport layer that is opposite to the surface of the electron transport layer, and
    a cover formed on the cathode,
    wherein a light emitting layer is disposed in the stopper chamber and contacts with the free $H^+$ ions on the surfaces of the hole transport layer and the electron transport layer to allow H atoms contained in a material of the light emitting layer to exchange with the free $H^+$ ions to connect the light emitting layer to the hole transport layer and the electron transport layer.

2. The flexible OLED as claimed in claim 1, wherein the free $H^+$ ions are formed on the surfaces of the hole transport layer and the electron transport layer by acidification treatment of the surfaces of the hole transport layer and the electron transport layer.

3. The flexible OLED as claimed in claim 2, wherein the acidification treatment is carried out with an acid solution that comprises one of hydrochloric acid solution and sulfuric acid solution and has a mass percentage ranging between 5% and 20%.

4. The flexible OLED as claimed in claim 2, wherein the stopper chamber is formed of $TiO_2$ and has a depth ranging from 10 to 100 nm.

5. The flexible OLED as claimed in claim 1, wherein the light emitting layer is formed of a liquid luminescent material that comprises a fluorescent material and a solvent.

6. The flexible OLED as claimed in claim 5, wherein the fluorescent material comprises one of rubrene, 8-hydroxyquinoline aluminum, BCzVBi and DSA-Ph; and the solvent comprises one of a carbazole-based material and a triphenylamine-based material.

7. The flexible OLED as claimed in claim 1, wherein the hole transport layer and the electron transport layer are each a $TiO_2$ film having a thickness in a range from 200 to 1000 nm.

8. The flexible OLED as claimed in claim 7, wherein the stopper chamber is formed of $TiO_2$ and has a depth ranging from 10 to 100 nm.

9. The flexible OLED as claimed in claim 1, wherein the stopper chamber is formed of $TiO_2$ and has a depth ranging from 10 to 100 nm.

* * * * *